US006954102B2

(12) United States Patent
Bedarida et al.

(10) Patent No.: US 6,954,102 B2
(45) Date of Patent: Oct. 11, 2005

(54) FAST DYNAMIC MIRROR SENSE AMPLIFIER WITH SEPARATE COMPARISON EQUALIZATION AND EVALUATION PATHS

(75) Inventors: Lorenzo Bedarida, Vinercate (IT); Andrea Sacco, Alessandria (IT); Mirella Marsella, Milano (IT); Massimiliano Frulio, Milano (IT)

(73) Assignee: Atmel Corporation, San Jose, CA (US)

( * ) Notice: Subject to any disclaimer, the term of this patent is extended or adjusted under 35 U.S.C. 154(b) by 30 days.

(21) Appl. No.: 10/407,640

(22) Filed: Apr. 3, 2003

(65) Prior Publication Data

US 2004/0051564 A1 Mar. 18, 2004

(30) Foreign Application Priority Data

Sep. 13, 2002 (IT) ........................................ 2002A0798

(51) Int. Cl.[7] .................................................. G03F 1/10

(52) U.S. Cl. ........................ 327/539; 327/537; 327/538

(58) Field of Search ................................ 323/312, 313, 323/314, 315, 316, 317; 327/51, 52, 538, 539, 541

(56) References Cited

U.S. PATENT DOCUMENTS 5,218,570 A * 6/1993 Pascucci et al. ....... 365/185.21
5,386,388 A * 1/1995 Atwood et al. ............. 365/201
5,773,997 A * 6/1998 Stiegler ....................... 327/53
6,133,764 A * 10/2000 Griffith et al. ................ 327/65
6,507,175 B2 * 1/2003 Susak et al. ................ 323/235
6,624,685 B2 * 9/2003 Shih et al. .................. 327/541

* cited by examiner

*Primary Examiner*—Tuan T. Lam
*Assistant Examiner*—Hiep Nguyen
(74) *Attorney, Agent, or Firm*—Sierra Patent Group, Ltd.

(57) ABSTRACT

A memory cell sensing circuit to sense data from a memory cell includes a reference memory cell coupled to pass a reference current. A sense amplifier has a first input and a second input coupled to a bias circuit of the data memory cell. A first mirror mirrors the reference current to a voltage coupled to the first input of the sense amplifier. A second mirror mirrors the reference current to a voltage coupled to the bias circuit of the data memory cell. A third mirror mirrors the reference current to a voltage coupled to the second input of the sense amplifier through a pass gate.

7 Claims, 4 Drawing Sheets

FAST DYNAMIC MIRROR SENSE AMPLIFIER WITH SEPARATE COMPARISON EQUALIZATION AND EVALUATION PATHS

PRIORITY CLAIM

This application claims priority to Italian Application Serial Number 2002A000798, filed Sep. 13, 2002.

BACKGROUND OF THE INVENTION

1. Field of the Invention

The present invention relates to sense-amplifier circuits. More particularly, the present invention relates to a fast dynamic mirror sense amplifier with separate comparison, equalization and evaluation paths.

2. The State of the Art

In order to correctly read the data item from a memory cell from a memory matrix, it is known to compare the data item read from the memory matrix cell with the data item read from a reference matrix cell, so as to detect the difference between a programmed cell and an erased cell. For this purpose, memory matrices are usually preset so that a reading of the data item from a memory cell is matched by a reading of an amount of current that flows across a reference matrix cell. The difference between the two readings determines the particular data item read.

A first possible implementation is to use a local reference memory cell for each sense amplifier as illustrated in FIG. 1. Reference memory cell 10 is biased by n-channel MOS transistor 12 in cascode configuration using inverter 14 fed by diode-connected p-channel MOS transistor 16 used as a current source. The current drawn by p-channel MOS transistor 16 is mirrored to p-channel MOS transistor 20, which sources current to matrix memory cell 18 through n-channel MOS transistor 22 in cascode configuration using inverter 24. During an equalization period of timely length, pass gate 26 is enabled and is used to charge the MAT node 28 to the potential of the REF node 30. At the end of the equalization period, pass gate 26 is turned off and the MAT node 28 is allowed to move toward either the power supply potential or ground potential depending on the difference between the reference cell current and the matrix cell current. The sense operation is performed by a comparator 32, having the nodes REF and MAT as its inputs.

The approach of FIG. 1 has the disadvantage of causing disturbs on the REF node, both during the equalization period and the subsequent sense period. At the beginning of the equalization period the MAT node 28 is grounded and, after the pass gate 26 has been enabled, it is directly connected to the REF node 30, whose transient is in this way disturbed. Considering that the gate of the p-channel MOS transistor 20 at REF node 30 is an input of the comparator 32, inevitably, during the evaluation period, the commutation of the output couples a disturb onto it and, consequently, disturbs the reference current.

Moreover having many reference cells is disadvantageous both from the point of view of die area occupation and from the point of view of managing these reference cells during testing operations.

A normal evolution of the system illustrated in FIG. 1 consists of locally repeating the reference cell current for each sense amplifier by using a local current mirror as shown in FIG. 2. The same reference-current-generating structure shown in FIG. 1 is used in the system of FIG. 2, employing reference cell 10, n-channel MOS transistor 12 in cascode with inverter 14 and p-channel MOS transistor current source 16. The current drawn by the reference memory cell 10 is mirrored from p-channel MOS transistor 16 to p-channel MOS mirror transistor 34. Diode-connected n-channel MOS transistor 36 establishes the REF_N voltage.

To eliminate the disturbs during the equalization and the evaluation periods, the circuit of FIG. 2 makes use of additional local current mirrors to generate two reproductions of the REF_P node (EQ_LEV and COMP_LEV) to be used for the equalization and as reference input of the comparator 32. Local current mirror structures 38, 40, and 42 each employ a p-channel MOS transistor (shown as 38-1, 40-1, and 42-1, respectively, in mirror structures 38, 40, and 42) and an n-channel MOS transistor (shown as 38-2, 40-2, and 42-2, respectively, in mirror structures 38, 40, and 42) to generate the signals REF_P, EQ_LEV, and COMP_LEV. P-channel MOS mirror transistor 20 and n-channel MOS transistor 22 cascoded with inverter 24 provide a mirrored current for matrix memory cell 18 as in the circuit of FIG. 1. The EQ_LEV voltage is supplied to the MAT node input to comparator 32 through pass gate 46.

In a system that uses the architectural approach of FIG. 2, the p-channel MOS mirror transistor 38-1 in local current mirror 38 must be set to precisely the reference cell current because, during the evaluation period, the voltage on the node MAT will increase or decrease depending on the difference between the matrix cell current and the current biasing the p-channel MOS mirror transistor 38-1. The EQ_LEV and COMP_LEV signals are obtained in the same way, starting from the reference cell current, using local current mirrors 40 and 42 identical to local current mirror 38 used to generate REF-P signal.

In systems like that shown in FIG. 2, the REF-N node supplies three different subcircuits, multiplied by the number of sense amplifiers, and thus has a very high capacitive load.

BRIEF DESCRIPTION OF THE INVENTION

The present invention provides a fast dynamic mirror sense amplifier with separate comparison equalization and evaluation paths. A first memory cell sensing circuit comprises: a reference memory cell coupled to pass a reference current; a data memory cell having a bias circuit; a sense amplifier having a first input and a second input coupled to the bias circuit of the data memory cell; a pass gate; a reference-voltage source; a comparison current coupled between the reference-voltage source and the first input of the sense amplifier to a voltage coupled to the bias circuit of the data memory cell; an equalization circuit coupled between the reference-voltage source and the second input of the sense amplifier through the pass gate; and a mirror mirroring the reference current to a voltage coupled to the first input of the sense amplifier.

Another memory cell sensing circuit to sense data from a memory cell includes a reference memory cell coupled to pass a reference current. A sense amplifier has a first input and a second input coupled to a bias circuit of the data memory cell. A first mirror mirrors the reference current to a voltage coupled to the first input of the sense amplifier. A second mirror mirrors the reference current to a voltage coupled to the bias circuit of the data memory cell. A third mirror mirrors the reference current to a voltage coupled to the second input of the sense amplifier through a pass gate.

BRIEF DESCRIPTION OF THE DRAWING FIGURES

DETAILED DESCRIPTION OF THE INVENTION

Persons of ordinary skill in the art will realize that the following description of the present invention is only illustrative and not in any way limiting. Other embodiments of this invention will be readily apparent to those skilled in the art having benefit of this disclosure.

It is important that the REF-N node reaches its stable value as soon as possible and with the highest accuracy because the reference current is constant when the REF-N node reaches its stable value and it is thus possible to perform an accurate sense operation. For this reason it is important to make the capacitive load of the REF-N node as light as possible, limiting the number of gates connected to it to the lowest possible number.

The present invention advantageously exploits the fact that it is necessary to put an accurate current information to precisely repeat the reference-cell current only on the p-channel MOS transistor from which the reference voltage is derived, while two voltage levels that are not as accurate may be used to generate the equalization and the evaluation potentials.

In order to detect the movement of the voltage on the MAT node toward the power supply potential or ground potential it is sufficient to have a reference voltage for the comparator 32 that may be generated completely independently from the circuit that replicates the reference current in the matrix memory cell 18 for the comparison with the matrix cell current.

The reference voltage for the REF input node of the comparator 32 is however related to the voltage value toward which the MAT node must be taken during the equalization period; the equalization voltage level must be inside the operating range that allows the sense amplifier to work properly.

Figure 3:
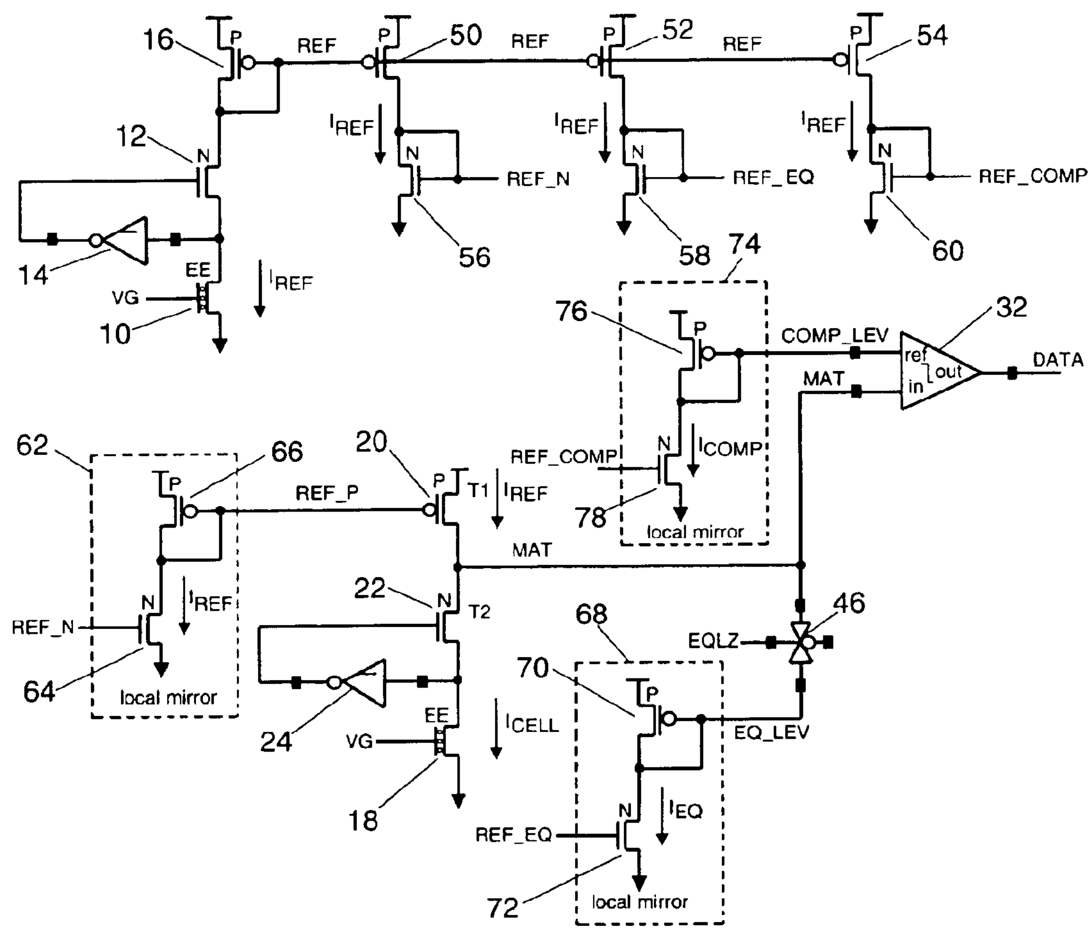
FIG. 3 is a schematic diagram of an illustrative fast dynamic mirror sense amplifier with separate comparison equalization and evaluation paths according to the principles of the present invention.

Referring now to FIG. 3, a schematic diagram illustrates a solution in accordance with the present invention that allows minimizing the number of gates connected to the REF-N node and hence its capacitance, making it relatively immune from disturbs due to capacitive coupling.

Figure 1:
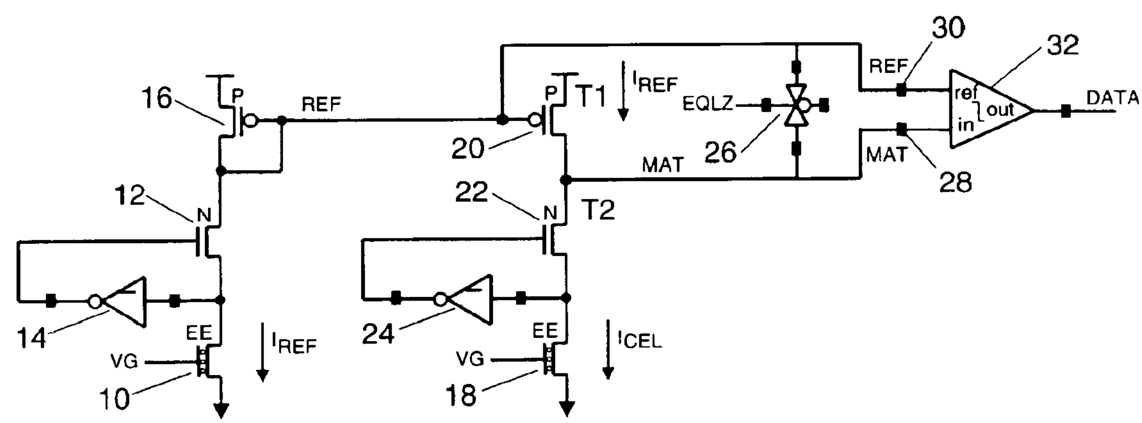
FIG. 1 is a schematic diagram of a first prior-art memory-sensing scheme using a local reference cell for each sense amplifier.

The same reference-current-generating structure shown in FIG. 1 is used in the system of FIG. 3, employing reference cell 10, n-channel MOS transistor 12 in cascode with inverter 14 and p-channel MOS transistor current source 16.

The current drawn by the reference memory cell 10 is mirrored from p-channel MOS transistor 16 to p-channel MOS mirror transistors 50, 52, and 54. Diode-connected n-channel MOS transistor 56 establishes the REF_N voltage. Diode-connected n-channel MOS transistors 58, and 60, respectively, establish the REF_EQ and REF_COMP voltages.

The REF_N voltage is supplied to a first current mirror 62 at the gate of n-channel MOS transistor 64. N-channel MOS transistor 64 is driven by a current-source diode-connected p-channel MOS transistor 66. The current through diode-connected p-channel MOS transistor 66 is mirrored to the matrix memory cell 18, configured as in the prior figures using p-channel MOS mirror transistor 20 and n-channel MOS transistor 22 cascoded with inverter 24 provide a mirrored current for matrix memory cell 18 as in the circuit of FIG. 1.

In the circuit of FIG. 3, the voltage references for the comparator and the equalization circuit are locally generated in each sense amplifier by separate local dedicated mirrors. Each local mirror uses a dedicated reference signal derived from n-channel MOS transistor 16. Thus the equalization voltage level is generated by local mirror 68 at the gate and source of diode-connected p-channel MOS transistor 70, sourcing current to n-channel MOS transistor 72. The gate of n-channel MOS transistor 72 is driven by the REF_EQ voltage at the gate and drain of the diode-connected n-channel MOS transistor 58. The equalization potential is supplied to the MAT node input to comparator 32 through pass gate 46. Similarly, the COMP_LEVEL comparison voltage level is generated by local mirror 74 at the gate and source of diode-connected p-channel MOS transistor 76, sourcing current to n-channel MOS transistor 78. The gate of n-channel MOS transistor 78 is driven by the REF COMP voltage at the gate and drain of the diode-connected n-channel MOS transistor 60.

This arrangement significantly reduces the capacitive load on the reference current line. The accuracy (and dimensions) of these current mirrors may be lower than accuracy of the current mirror used for generation of the reference current.

Figure 2:
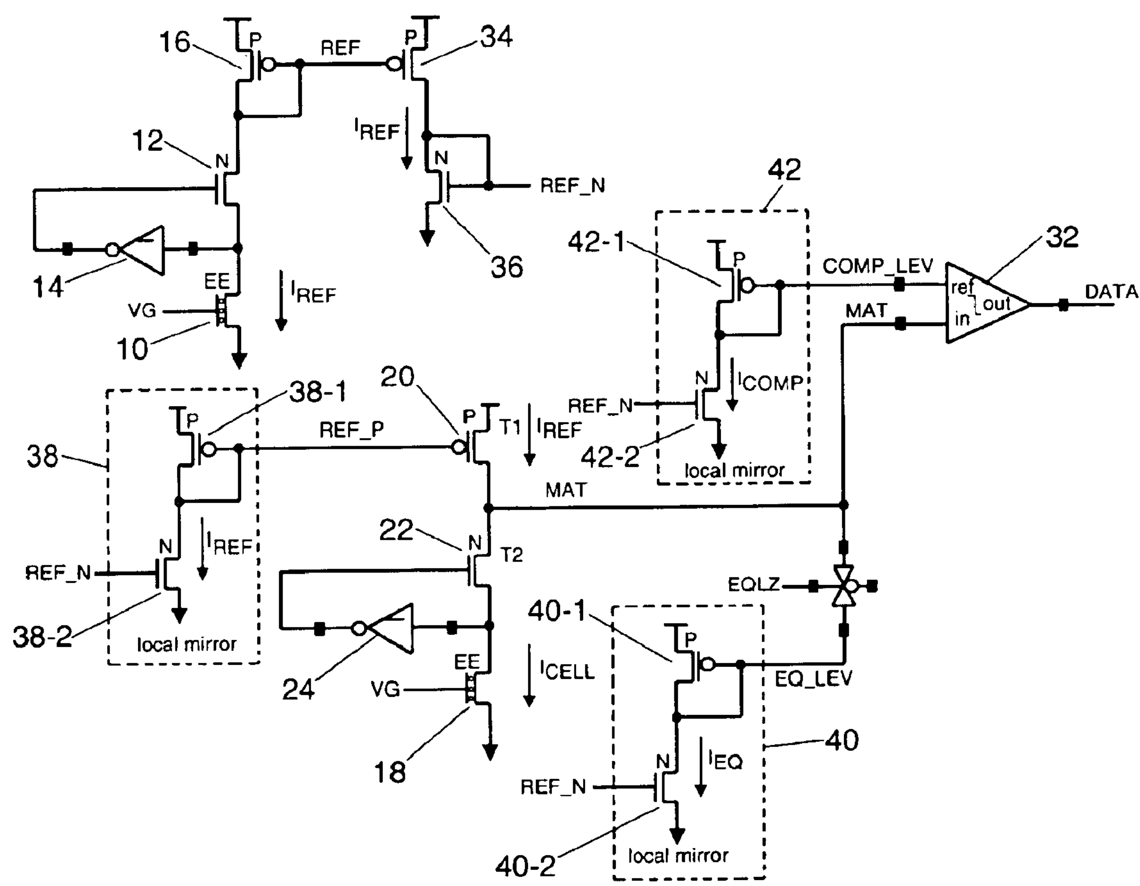
FIG. 2 is a schematic diagram of another prior-art memory-sensing scheme that operates by locally repeating the reference cell current for each sense amplifier by using a local current mirror.

This solution provides a capacitive load lowered by a factor 2 or 3 and thus allows the reference current to reach its stable value faster in comparison with the solution shown in FIG. 2, without being disturbed during read phases.

From the observation that at the input of the comparator the information to be processed is contained in the difference between two voltage levels, arises the idea of further freeing the circuit supplying the reference current from those used for equalization and evaluation.

Figure 4:
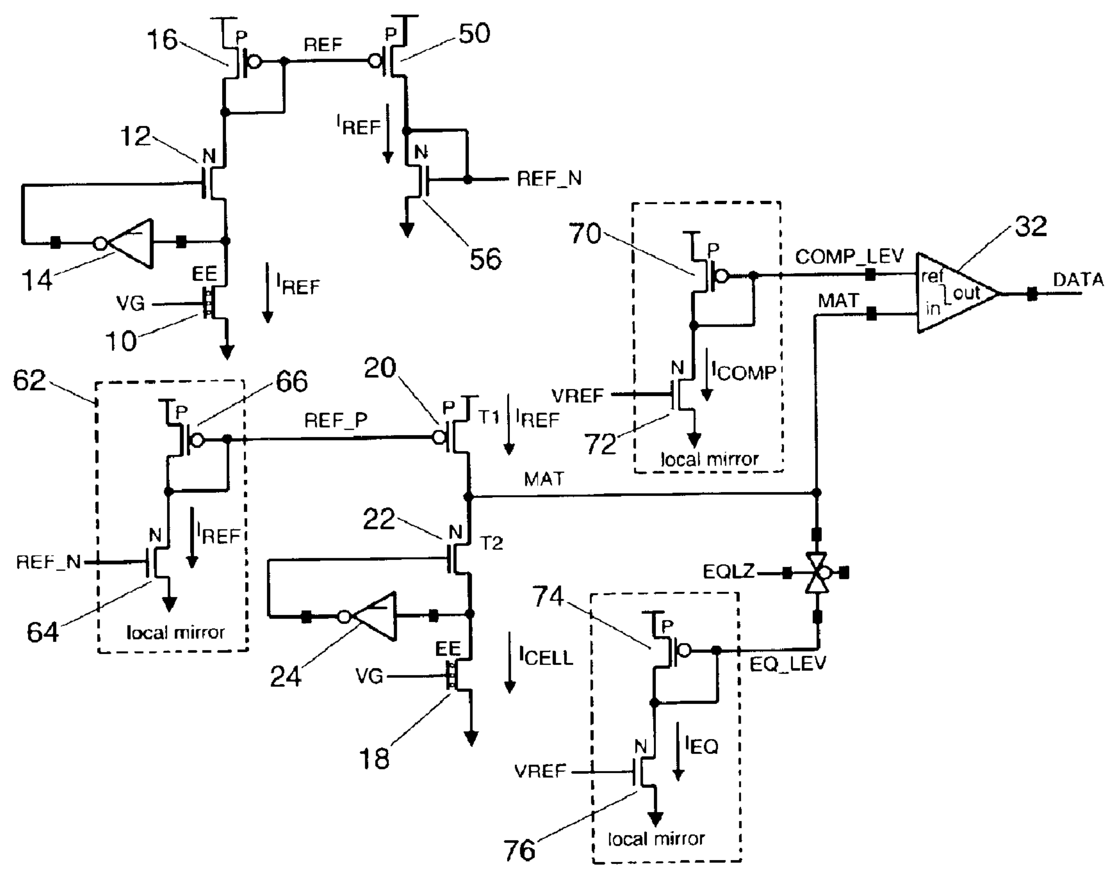
FIG. 4 is a schematic diagram of a generalization of a fast dynamic mirror sense amplifier with separate comparison equalization and evaluation paths according to the principles of the present invention.

FIG. 4 shows a generalization of the architecture of FIG. 3. The circuit of FIG. 4 generally implements the need to have a very accurate current information related to the reference cell only for the evaluation path while for the equalization and comparator paths the information needed is voltage information that is not necessarily related to the reference current but necessary only to initially set the MAT, EQ_LEV and COMP_LEV nodes to a value within the correct range.

The circuit of FIG. 4 employs reference cell 10, n-channel MOS transistor 12 in cascode with inverter 14 and p-channel MOS transistor current source 16. The current drawn by the reference memory cell 10 is mirrored from p-channel MOS transistor 16 to p-channel MOS mirror transistor 50 and n-channel MOS transistor 56. The REF_N voltage from the gate and drain of n-channel MOS transistor 56 is supplied to a current mirror 62 at the gate of n-channel MOS transistor 64. N-channel MOS transistor 64 is driven by a current-source diode-connected p-channel MOS transistor 66. The current through diode-connected p-channel MOS transistor 66 is mirrored to the matrix memory cell 18, configured as in the prior figures using p-channel MOS mirror transistor 20 and n-channel MOS transistor 22 cascoded with inverter 24 provide a mirrored current for matrix memory cell 18 as in the circuit of FIG. 1.

The voltage references for the comparator and for the equalization circuit are locally supplied in each sense amplifier by mean of diode-connected p-channel MOS transistors 70 and 76, respectively, biased by the current drawn by n-channel MOS transistors 72 and 78, respectively, whose gates are both tied to a fixed potential $V_{REF}$ independent from power supply and temperature variations, which may be supplied by, for example, a band-gap reference.

The bias current for the comparator and for the equalization circuit obtained in this way is not independent from power supply and temperature variations, nor follows the reference cell current variations but, opportunely dimensioning the circuit components, it is possible to keep the voltage references for the comparator and for the equalization circuit inside the limits needed to guarantee the system functionality.

There are several constraints to be observed so that the system works properly. First, the p-channel MOS transistors in the memory cell bias circuits must operate in saturation in order to operate as a current mirror. The cascode n-channel MOS transistors must also operate in saturation. Finally, the reference voltage for the comparator must properly bias the comparator input stage so that its input transistors operate in their saturation regions.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A memory-cell sensing circuit comprising:

a supply-voltage potential;

a reference memory cell;

a reference-current bias circuit coupled to said reference memory cell, said reference current bias circuit including a first p-channel MOS transistor having a source coupled to said supply voltage potential, a drain, and a gate, a first cascode n-channel MOS transistor having a drain coupled to said drain and said gate of said first p-channel MOS transistor and a source coupled to said reference memory cell;

a reference node;

a reference-node biasing circuit including a second p-channel MOS transistor having a source coupled to said supply-voltage potential, a gate coupled to said gate of said first p-channel MOS transistor, and a drain, and a second n-channel MOS transistor having a drain and a gate coupled to said drain of said second p-channel MOS transistor and to said reference node, and a source coupled to ground;

an equalization node;

an equalization-node biasing circuit including a third p-channel MOS transistor having a source coupled to said supply-voltage potential, a gate coupled to said gate of said first p-channel MOS transistor, and a drain, and a third n-channel MOS transistor having a drain and a gate coupled to said drain of said third p-channel MOS transistor and to said equalization node, and a source coupled to ground a comparison node;

a comparison-node biasing circuit including a fourth p-channel MOS transistor having a source coupled to said supply-voltage potential, a gate coupled to said gate of said first p-channel MOS transistor, and a drain, and a fourth n-channel MOS transistor having a drain and a gate coupled to said drain of said fourth p-channel MOS transistor and to said comparison node, and a source coupled to ground;

a sense amplifier having a first input and a second input;

a first mirror including a fifth p-channel MOS transistor having a source coupled to said supply-voltage potential, a drain, and a gate coupled to said first input of said sense amplifier, and a fifth n-channel MOS transistor having a drain coupled to said first input of said sense amplifier, a gate coupled to said comparison node, and a source coupled to ground;

a pass gate having a first terminal, a second terminal coupled to said second input of said sense amplifier, and a control terminal;

a second mirror including a sixth p-channel MOS transistor having a source coupled to said supply-voltage potential, a drain, and a gate coupled to said first terminal of said pass gate, and a sixth n-channel MOS transistor having a drain coupled to said first terminal of said pass gate, a gate coupled to said equalization node, and a source coupled to ground;

at least one data memory cell coupled to a data-current bias circuit including a seventh p-channel MOS transistor having a source coupled to said supply voltage potential, a drain, and a gate, a second cascode n-channel MOS transistor having a drain coupled to said drain of said seventh p-channel MOS transistor and to said second input of said sense amplifier, and a source coupled to said at least one data-memory cell; and a third mirror including an eighth p-channel MOS transistor having a source coupled to said supply-voltage potential, and a drain and a gate coupled to said gate of said seventh p-channel MOS transistor, and an eighth n-channel MOS transistor having a drain coupled to said drain and said gate of said eighth p-channel MOS transistor, a gate coupled to said reference node, and a source coupled to ground.

2. A memory cell sensing circuit comprising:

a reference memory cell configured to pass a reference current;

a first current mirror coupled to the reference memory cell and configured to mirror the reference current and provide a REF-N voltage;

a second current mirror coupled to the first current mirror and configured to mirror the reference current and provide a REF_COMP voltage;

a third current mirror coupled to the first current mirror and configured to receive the REF_N voltage, to mirror the reference current, and to provide a REF_P voltage;

a fourth current mirror coupled to the third current mirror and configured to receive the REF_P voltage and mirror the reference current;

a matrix memory cell coupled to the fourth current mirror and configured to pass a portion of the mirrored reference current from the fourth current mirror;

a MAT node coupled to the matrix memory cell and configured convey a matrix memory cell voltage;

a fifth current mirror coupled to the second current mirror and configured to receive the REF_COMP voltage and provide a COMP_LEV voltage; and a comparator having a first input coupled to the fifth current mirror and a second input coupled to the MAT node, the comparator configured to compare the matrix memory cell voltage to the COMP_LEV voltage.

3. The memory cell sensing circuit of claim 2 further comprising:

a sixth current mirror coupled to the first current mirror and configured to mirror the reference current and provide a REF_EQ voltage;

a passgate coupled to the second input of the comparator and to the matrix memory cell; and a seventh current mirror coupled to the sixth current mirror and configured to receive the REF_EQ voltage and provide a EQ_LEV voltage, wherein the passgate is further configured to provide the EQ_LEV voltage to the MAT node during an equalization period of the memory cell sensing circuit.

4. A memory cell sensing circuit comprising:

a reference memory cell configured to pass a reference current;

a first current mirror coupled to the reference memory cell and configured to mirror the reference current and provide a REF-N voltage;

a voltage source configured to generate a fixed voltage, the voltage source differing from the first current mirror;

a second current mirror coupled to the first current mirror and configured to receive the REF_N voltage, to mirror the reference current, and to provide a REF_P voltage;

a third current mirror coupled to the second current mirror and configured to receive the REF_P voltage and mirror the reference current;

a matrix memory cell coupled to the third current mirror and configured to pass a portion of the mirrored reference current from the third current mirror;

a MAT node coupled to the matrix memory cell and configured convey a matrix memory cell voltage;

a fourth current mirror coupled to the voltage source and configured to receive the fixed voltage and provide a COMP_LEV voltage; and a comparator having a first input coupled to the fourth current mirror and a second input coupled to the MAT node, the comparator configured to compare the matrix memory cell voltage to the $COMP_{\_LEV}$ voltage.

5. The memory cell sensing circuit of claim 4 wherein the voltage source is a band-gap reference.

6. The memory cell sensing circuit of claim 4, further comprising:

a passgate coupled to the second input of the comparator and to the matrix memory cell; and a fifth current mirror coupled to the voltage source and configured to receive the fixed voltage and provide a EQ_LEV voltage, wherein the passgate is further configured to provide the EQ_LEV voltage to the MAT node during an equalization period of the memory cell sensing circuit.

7. The memory cell sensing circuit of claim 6 wherein the voltage source is a band-gap reference.

* * * * *